United States Patent
Han et al.

(10) Patent No.: US 9,356,466 B2
(45) Date of Patent: May 31, 2016

(54) TEMPERATURE REGULATION OF INDUCTIVE CHARGING DEVICES IN EXTREME VEHICLE ENVIRONMENTS

(71) Applicant: GM GLOBAL TECHNOLOGY OPERATIONS LLC, Detroit, MI (US)

(72) Inventors: Taeyoung Han, Bloomfield Hills, MI (US); Chih-Hung Yen, Bloomfield Hills, MI (US); Shailendra Kaushik, Beverly Hills, MI (US); Bahram Khalighi, Troy, MI (US); Dan Lascu, Northville, MI (US); Kenneth L. Porrett, Grand Blanc, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 202 days.

(21) Appl. No.: 14/226,917

(22) Filed: Mar. 27, 2014

(65) Prior Publication Data

US 2014/0293538 A1 Oct. 2, 2014

Related U.S. Application Data

(60) Provisional application No. 61/806,038, filed on Mar. 28, 2013.

(51) Int. Cl.
*H05K 7/20* (2006.01)
*H02J 7/00* (2006.01)
*H02J 7/02* (2016.01)

(52) U.S. Cl.
CPC .......... *H02J 7/025* (2013.01); *H05K 7/20145* (2013.01)

(58) Field of Classification Search
CPC .............................. H05K 7/20845; H02J 7/025
See application file for complete search history.

(56) References Cited

U.S. PATENT DOCUMENTS

| | | | | |
|---|---|---|---|---|
| 5,230,016 A * | 7/1993 | Yasuda | ............... | H02J 7/0044 379/426 |
| 8,525,471 B2 * | 9/2013 | Thorsell | ............... | B60N 3/002 320/107 |
| 8,624,547 B2 * | 1/2014 | Thorsell | ............... | B60N 3/002 320/107 |
| 9,142,976 B2 * | 9/2015 | Chen | ............... | H04B 5/0037 |
| 9,205,753 B2 * | 12/2015 | Winget | ............... | B60L 11/182 |
| 2005/0168191 A1 * | 8/2005 | Lee | ............... | G06F 1/1632 320/114 |
| 2007/0152633 A1 * | 7/2007 | Lee | ............... | G06F 1/1632 320/114 |
| 2013/0234656 A1 * | 9/2013 | Lambert | ............... | H02J 7/0042 320/108 |
| 2014/0007594 A1 * | 1/2014 | Lofy | ............... | H05K 7/20845 62/3.2 |
| 2014/0062392 A1 * | 3/2014 | Lofy | ............... | H05K 7/20845 320/108 |
| 2014/0077758 A1 * | 3/2014 | Kaushik | ............... | H02J 7/025 320/108 |

FOREIGN PATENT DOCUMENTS

JP          11098705 A    *   4/1999

* cited by examiner

*Primary Examiner* — Robert J Hoffberg

(57) ABSTRACT

A thermal conditioning system for an inductive charging system. An open enclosure charging unit includes at least one surface generating an electromagnetic field for inductively charging a portable device. A primary conduit coupled to the open enclosure charging unit. The primary conduit outputs conditioned air to the open enclosure charging unit. The conditioned air output by the primary conduit maintains a temperature of the portable device at a predetermined temperature range within the open enclosure charging unit.

19 Claims, 8 Drawing Sheets

TEMPERATURE REGULATION OF INDUCTIVE CHARGING DEVICES IN EXTREME VEHICLE ENVIRONMENTS

BACKGROUND OF INVENTION

An embodiment relates generally to embodiment relates generally to rechargeable battery systems in a vehicle.

Electronic portable devices such as cell phones are powered by battery packs that require recharging. While it is known that such portable devices utilize contact terminals for transferring electrical energy between an external power source (e.g., power outlet) and the electronic portable device, contactless charging uses inductive charging to recharge portable devices without the electrically coupling contact terminals to transfer the electrical energy to the electrical portable device. Examples of such portable devices include cordless telephones, electronic toothbrushes, and other electronic convenience devices. An inductive charging system typically includes a base charging unit that includes an inductive coil for generating an electromagnetic field. An electrical charge is induced in an inductive coil in the electrical portable device by the inductive coil of the base charging unit. The induced electrical charge is converted to a DC voltage for recharging the battery.

Electrical devices such as cell phones have a self-protection mode where the device enters a safe charging mode if the temperature of the cell phone becomes greater than a predetermined temperature. The safe charging mode involves allowing only a trickle charge of electrical energy charge the battery. This prevents damage to the battery as well as the electronic components with the cell phone. Typically ambient temperature of an environment, such as a room of a house or building, will not cause the cell phone to enter a safe charging mode; however, charging environments such as vehicle have higher ambient temperatures, particularly if the vehicle is exposed to the sun. In such an environment, the cabin temperature can vary from 70 C to −20 C. This condition along with the heat generation of the primary base station may cause the cell phone battery temperature to increase above the predetermined temperature threshold and enter the safe charging mode. The inability of the cell phone to charge at the expected rate is a nuisance to the user and inconvenience to the user.

SUMMARY OF INVENTION

An advantage of the thermal conditioning system is a thermal cooling or heating for a portable device being inductively charged within a partially enclosed space. The thermal conditioning system utilizes air flow from an existing heating and ventilation source to thermally regulate a temperature of the space. Partially enclosed space typically includes a region where air flow is in inhibited and therefore, is not regulated by the ambient temperature of the larger compartments with the partially enclosed space is disposed within. By utilizing dedicated conduits for delivering conditioned air directly to the partially enclosed space, the temperature of the portable device that is being inductively charged may be regulated so the inductive charging of the portable device may be optimized with regards to temperature constraints.

In addition, the regions where the conduits attach to the existing heating and ventilation source, as well as the length and diameter of the conduits are selected to optimize pressure, air flow, and temperature blending to the partially enclosed space.

An embodiment contemplates a thermal conditioning system for an inductive charging system. An open enclosure charging unit includes at least one surface generating an electromagnetic field for inductively charging a portable device. A primary conduit coupled to the open enclosure charging unit. The primary conduit outputs conditioned air to the open enclosure charging unit. The conditioned air output by the primary conduit maintains a temperature of the portable device at a predetermined temperature range within the open enclosure charging unit.

DETAILED DESCRIPTION

Figure 1:
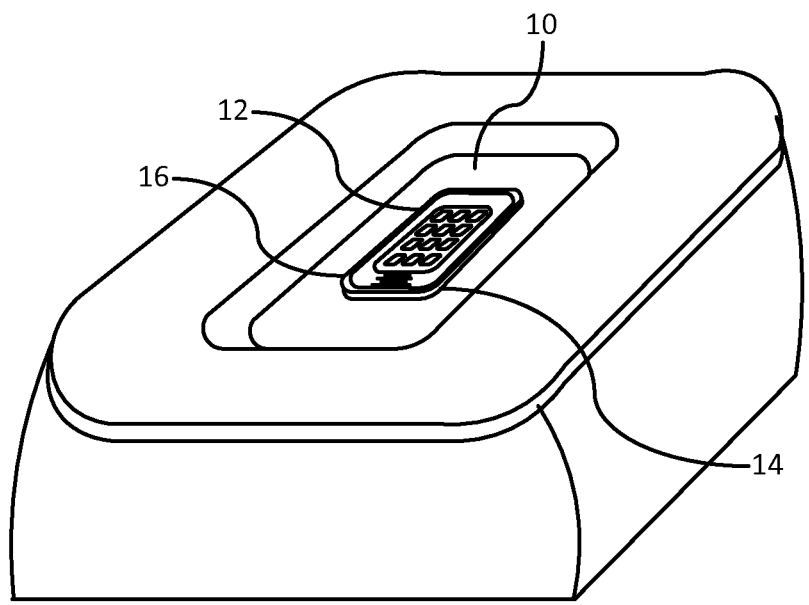
FIG. 1 is a horizontal console base charging unit for inductively recharging a portable device.
Figure 2:
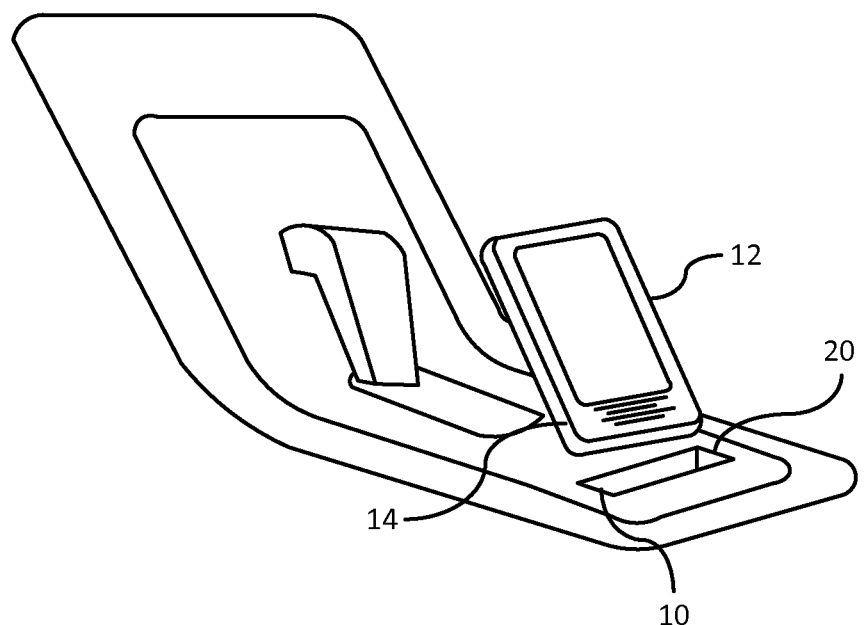
FIG. 2 is a vertical console base charging unit for inductively recharging a portable device.
Figure 3:
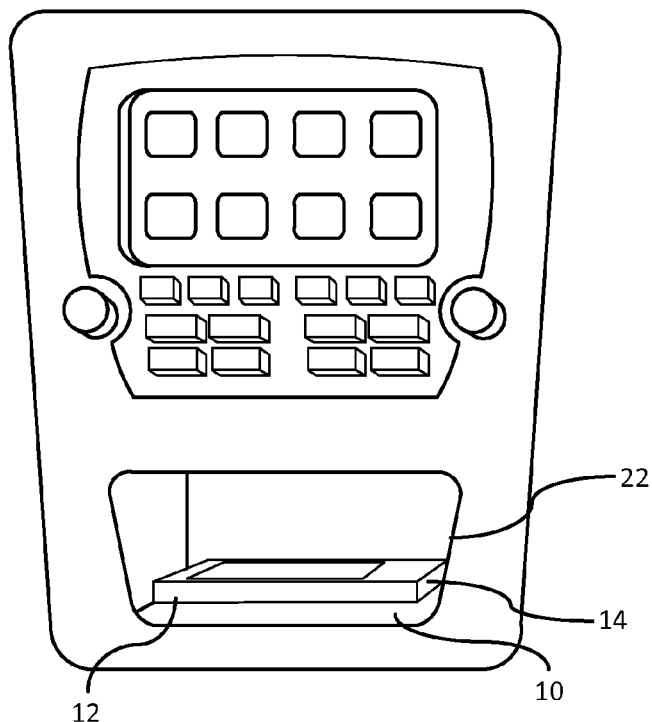
FIG. 3 an integrated console storage bin base charging unit for inductively recharging a portable device.

FIGS. 1-3 illustrate various configurations for charging a portable device. In FIG. 1, a base charging unit 10 is provided for inductively recharging a portable device 12 such as a cellular phone which is a communication device that is carried by a user for both transmitting and receiving wireless communication signals. It should be understood that the portable device can be any device that utilizes a rechargeable battery and can be recharged utilizing an inductive charging technique. The portable device 12 includes a rechargeable battery 14 that powers the portable device 12.

The rechargeable battery 14 is encased in a housing 16 for concealment and protection from exterior elements and is typically detachable from the portable device 12. The rechargeable battery 14 is re-charged while attached to the portable device 10 by way of inductive charging from the base charging unit 10. The portable device, as shown in FIG. 1, does not require a docking station; rather the portable device 12 only requires that the device is within a respective range of the charging unit 10 (e.g., powermat) for receiving an electromagnetic field of sufficient strength for inductively recharging the rechargeable battery 14. However, due to the orientation between the transmitting inductive coils and receiving inductive coils, a docking station may be used to orient the device in a direction for optimally receiving the generated electromagnetic field, if required.

FIG. 2 illustrates vertical implementation of the base charging unit. A pocketed area 20 allows the portable device 12 to be seated therein for inductively charging the portable device 12. There rechargeable battery 14 is recessed within the pocketed area for aligning inductive coils of the base charging unit 10 with the rechargeable battery 14. Air flow within the pocketed area 20 is stagnant due to its enclosed structure. Air flow is desirable for cooling the rechargeable battery 14 disposed therein.

FIG. 3 illustrates an integrated console storage (ICS) bin 22 which integrates the base charging unit 10. The ICS bin 22, as shown in FIG. 3, is a partially enclosed compartment with a single opening. A compartment door may be included to close off the compartment from the vehicle interior for securing contents therein. Due to the enclosed space with the single opening, the air flow within the compartment is stagnant which inhibits cooling the portable device 12, and more specifically, cooling the rechargeable battery 14 therein. As a result, the ICS bin 22 is subject to elevated temperatures relative to the open areas of the vehicle interior passenger compartment.

Figure 4:
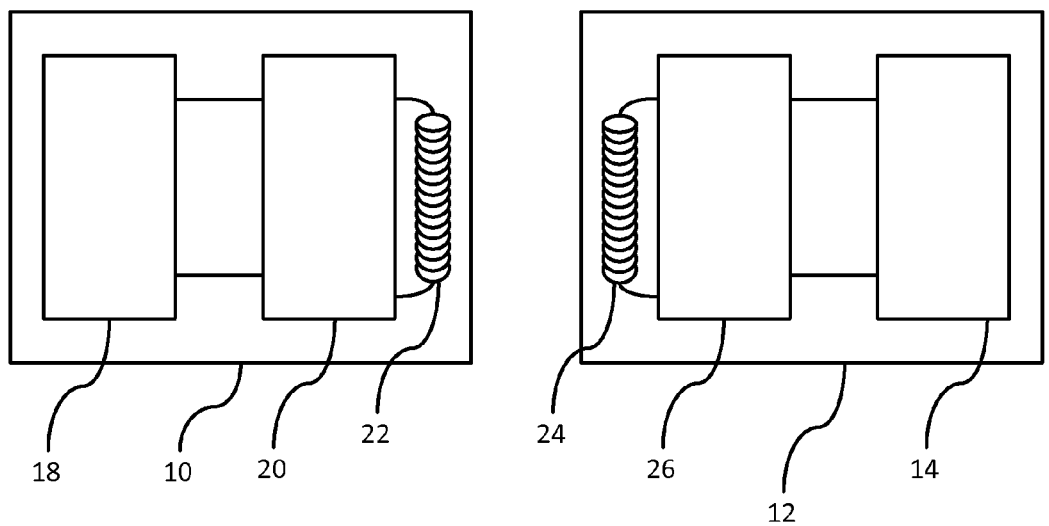
FIG. 4 is a block diagram of the inductive charging system for charging the portable device

FIG. 4 is a block diagram of the inductive charging system for charging the portable device 12. The base charging unit 10 includes an exterior power source 18, a primary control circuit 20, and a primary induction coil 22. The exterior power source 18 receives energy input from an energy generating device (e.g., alternator) or an energy storage device (e.g., battery) within the vehicle. If the input energy is from an energy storage device, such as a battery, then the exterior power source may include electrical circuitry that can convert the input energy to a respective alternating current (AC). The primary control circuit 20 regulates energy generated on the primary inductive coil 22.

The portable device includes a secondary inductive coil 24, a secondary control circuit 26, and a rechargeable battery 14. The secondary inductive coil 24 and the secondary control circuit 26 may be encased within the housing 16 that protects the rechargeable battery 14 from exterior elements. The secondary control circuit 26 includes electronic circuitry for rectifying an induced AC voltage generated on the secondary inductive coil 24 for recharging the rechargeable battery 14. The secondary control circuit 26 may include a controller or microprocessor for controlling both the amount and rate of charge provided to the rechargeable battery 14. The primary control circuit 20 applies a voltage waveform to the primary inductive coil 22 for energizing the primary inductive coil 24 at a respective voltage and frequency.

The rechargeable battery 14 of the portable device 12 during recharging will be influenced by the heat generation of the base charging unit 10. As shown in FIG. 1, the base charging unit 10 includes a powermat surface. The powermat surface includes a surface for supporting the portable device 12. The power source and primary control circuit/coils are disposed below the surface of the powermat. The powermat surface preferably includes a rubberized surface that prevents the portable device 12 from sliding around while the vehicle is in motion, and therefore, the powermat can accommodate various types of devices that have different shapes and sizes. Furthermore, the powermat surface must also not inhibit the electromagnetic field generated by the primary inductive coil from flowing to the portable device 12. It should be understood that the powermat surface is not restricted to a rubberized surface, but may include other materials suitable for maintaining the portable phone in a recharging position and allow the flow of the electromagnetic field from the primary inductive coil to the rechargeable battery of the portable device.

As described earlier, the temperature of both the portable device and the room ambient temperature influence a recharging of the portable device's battery. The temperature of the vehicle environment can vary from 70° C. (158° F.) to −20° C. (−4° F.). At steady state, the vehicle interior temperature is approximately 25° C. (77° F.). Should the battery temperature of the portable device exceed a predetermined temperature (e.g., 47° C./117° F.), the portable device enters a self-protection mode. In the self-protection mode, the charging current is decreased to prevent damage to the battery temperature. Therefore, if the self-protection mode is entered, then only a trickle charge is applied to the rechargeable battery (e.g., milli-amps). As a result, charge time for the rechargeable battery of the portable device is significantly increased and charging the battery utilizing the powermat where extreme environment fluctuations occur is not ideal.

Figure 5:
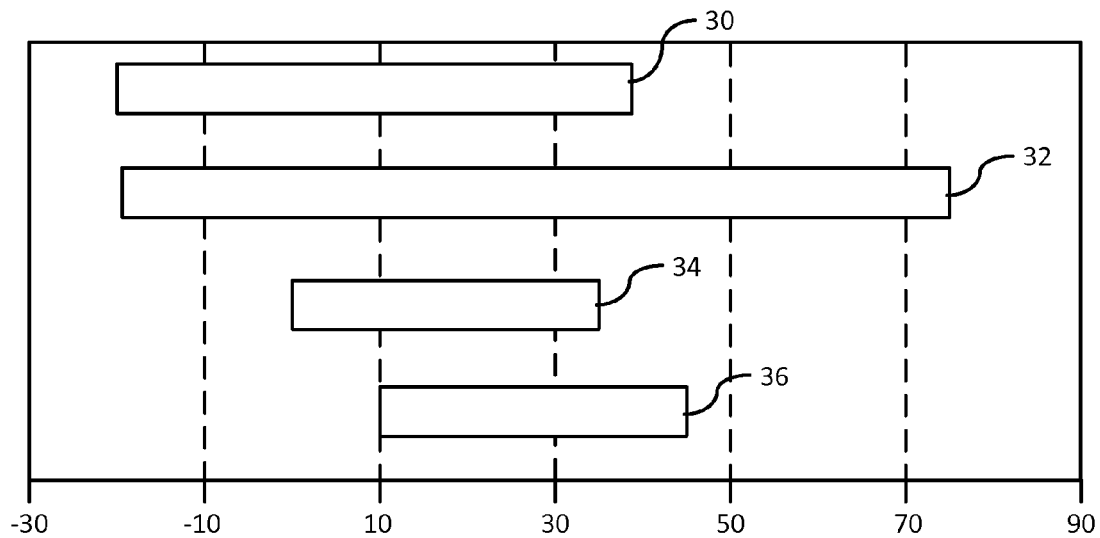
FIG. 5 illustrates a wireless charging system temperature operating chart.

FIG. 5 is illustrates a wireless charging system temperature operating chart for wirelessly changing a portable device such as a phone. A first temperature range 30 illustrates a typical ambient temperature range exterior of the vehicle. The ambient temperature typically ranges between −20° C. (−4° F.) to 40° C. (104° F.).

A second temperature range 32 for an interior passenger compartment ranges from −20° C. (−4° F.) to 75° C. (169° F.). Due to the lack of air flow and the intensification of heat transmitted through the glass from the sun, temperatures will increase more within the interior passenger compartment in contrast to the exterior temperature particularly at elevated temperatures or when the light rays from the sun penetrate the glass to the vehicle passenger compartment.

A third temperature range 34 for a portable device charging (e.g., smartphone) is typically in the range of −0° C. (32° F.) to 35° C. (95° F.). Outside of this temperature range, the device may have problems operating.

A fourth temperature range 36 for charging the portable device, such as a smartphone, is typically in the range of 10° C. (50° F.) to 45° C. (113° F.). If the rechargeable battery exceeds a certain temperature (e.g., 45° C.), the portable device enters a safe charging mode and only a trickle charge is applied to prevent permanent damage to the battery.

As shown from the temperature ranges in FIG. 5, particularly the portable device charging temperature range 36 and the interior passenger compartment temperature range 32, extreme temperature conditions may exist within the interior passenger compartment, and without adequate ventilation to the portable device, recharging the rechargeable battery is challenging when the base charging unit is integrated in substantially enclosed compartment bins or pocketed areas.

Figure 6:
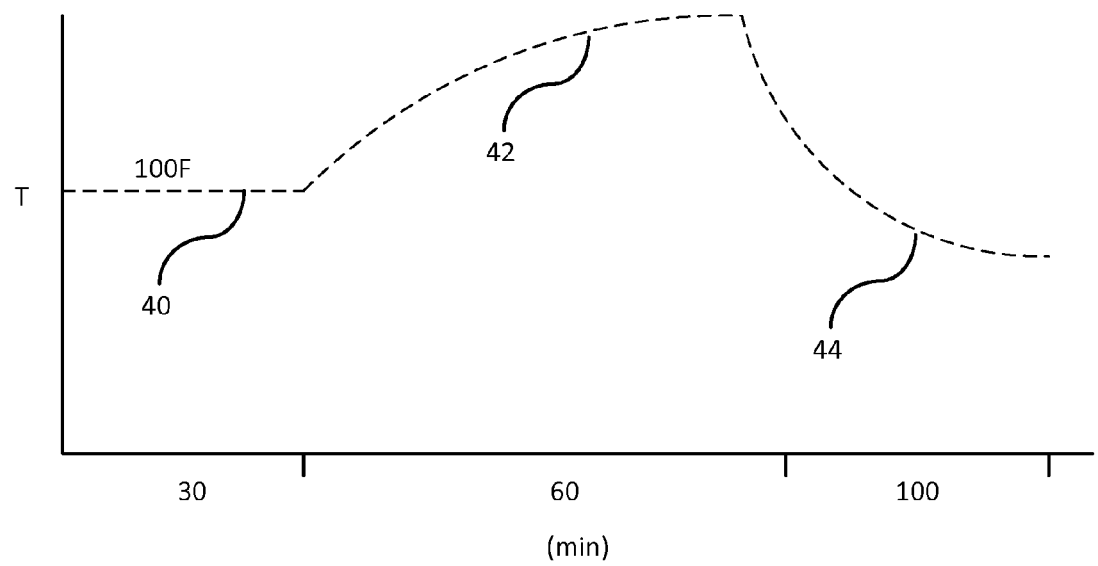
FIG. 6 is an exemplary hot soak and cool-down thermal test.

FIG. 6 illustrates a hot soak and cool-down thermal test during a summer drive. The x-axis represents time in minutes and the y-axis represents interior passenger compartment temperature. Recorded data for a first time range 40 (0-30 minutes) a condition where the windows are rolled down, the A/C is off, and the blower is on medium. This condition is to normalize the interior passenger compartment to an ambient temperature exterior of the vehicle. Recorded data for a second time range 42 (30-90 minutes) illustrates a gradual increase in temperature of the interior passenger compartment. The vehicle conditions are solar lamps on (e.g., 1000 watts/m$^2$), engine off, and windows closed. This is considered a vehicle parked (soaking in a parking lot on a hot and sunny day). Recorded data for a third time range 44 (90-190 minutes) illustrates a gradual decrease in temperature of the interior passenger compartment of the time range. The vehicle conditions include solar lamps on, the vehicle is driving, and the A/C is on and is set to 22° C. (72° F.) auto, while driving in stop and go city traffic. As illustrated in FIG. 6, without the aid of any other device, a person would have to wait a substantial amount of time for the rechargeable battery to cool in order for the temperature of the interior passenger compartment to reach the nominal temperature range required for recharging.

Figure 7:
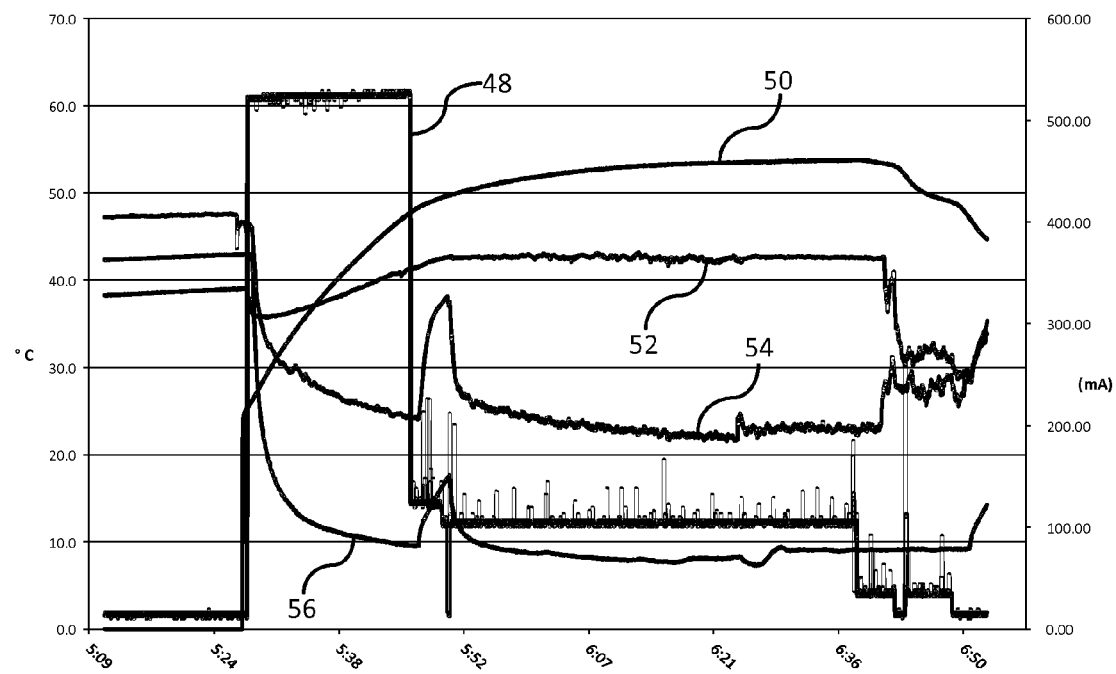
FIG. 7 is an exemplary phone charging event illustrating measurement data for the exemplary hot soak test of FIG. 6.

FIG. 7 illustrates an exemplary phone charging event based on temperature over time without the aid of any type of cooling of the portable device other that the vehicle ventilation system from the register vents. The recorded data for temperature and current measurements are as follows: portable device charging current 48, portable device battery temperature 50, ICS bin temperature 52, breath temperature 54, and HVAC vent temperature 56. As illustrated in FIG. 7, the ICS bin temperature 52, breath temperature 54, and air conditioning vent temperature 56 are respective temperatures recorded after the vehicle has been at rest soaking on a hot, sunny day. The temperature of the portable device is initially low since it is assumed that the portable device is not initially stored in the vehicle. At the 5:24 time mark, the portable device is brought into the vehicle, the vehicle is started, and inductive charging of the portable device is initiated. As shown by the battery temperature recorded data 50, the temperature of the portable device battery immediately increases. The temperature increase is initially due to current draw by the portable device due to charging the battery. As charging continues over time, the portable device battery temperature 50 increases further due to the ambient temperature of the vehicle.

As the vehicle continues to operate after the ignition start with the AC enabled, the HVAC vent temperature 56 decreases gradually and eventually a substantially steady state temperature is recorded at the HVAC vent. In addition, the interior passenger compartment temperature will decrease which correlates with the breath temperature 54. However, due to the poor circulation in the enclosed space of the ICS bin and the charging operation that is ongoing with the portable device in the ICS bin, the ICS bin temperature 52 is recorded at a slightly higher temperature in contrast to its temperature when the vehicle was soaking and the vehicle engine was off. As a result, the AC ventilation provided to the general area of the passenger compartment from the console ducts have very little to no effect in decreasing the ICS bin temperature below that which it was originally recorded.

In analyzing the flow of the portable charging device current 48, FIG. 7 shows that a full current charge 500 mA is supplied when charging is first initiated. When the temperature of the portable device battery reaches a predetermined temperature (e.g., 47° C. (117° F.)), safety countermeasures within the portable device will activate reducing the charging current to a trickle charge. Under such conditions, only a low current flow (=100 mA or less) is provided to the phone battery for preventing damage to the device. As a result, charging of the portable device is basically negligible under such conditions while the temperature of the battery remains greater than the predetermined temperature.

Figure 8:
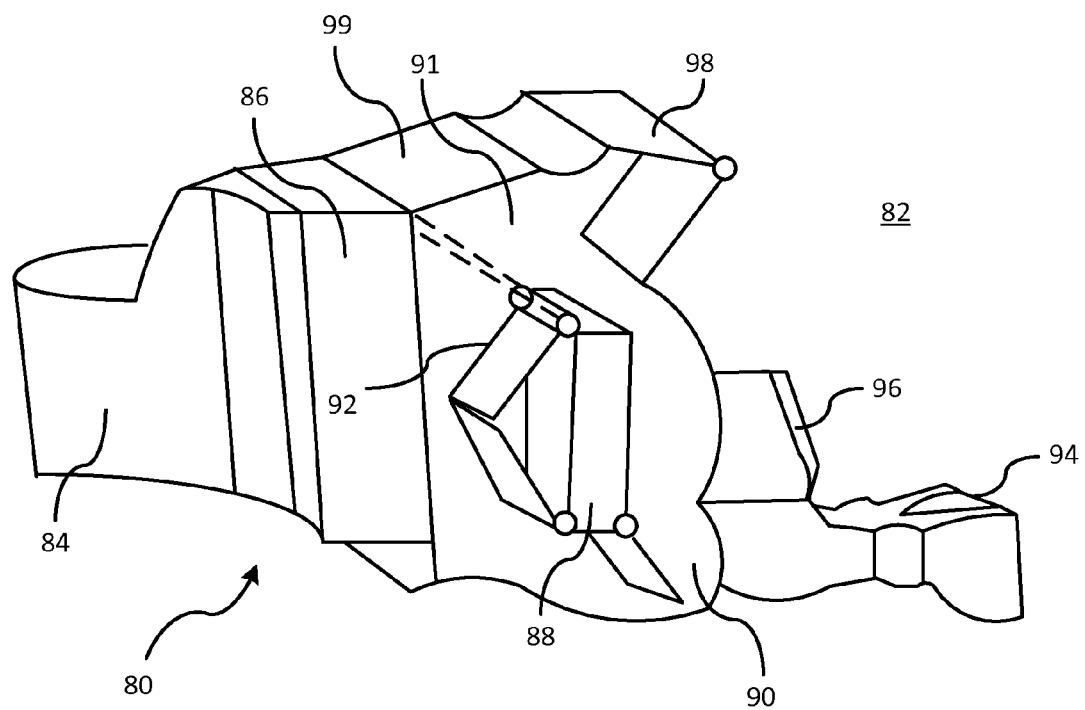
FIG. 8 is an illustration of an exemplary HVAC system for distributing air to a vehicle interior.

FIG. 8 is an illustration of an HVAC system for distributing air to a vehicle interior. A HVAC system includes a module assembly 80 for distributing heat and or/cooled air to an interior passenger compartment of the vehicle 82. The HVAC module assembly 80 includes a blower motor 84, an evaporator 86, a heater core 88, a first mixing chamber 90, a second mixing chamber 91, a temperature damper door (or temperature door) 92, a rear console register for rear passenger 94, a floor duct register, 96, an instrument panel duct register 98, and a window defrost duct register 99.

A blower motor 84 receives air from an exterior of the vehicle or an interior of the vehicle and generates a flow or forced air to the evaporator 86. A refrigerant flows into the evaporator where the forced air is passed through the evaporator 86. The refrigerant absorbs heat from the forced air as it flows through the evaporator 86. The resulting air flow from the evaporator is cooled air which is used to cool the interior passenger compartment 82. The temperature damper 92 is positioned upstream of the heater core 88. When in a closed position, the temperature damper 92 prevents forced air from flowing through the heater core 88. The cooled air is diverted around the heater and is then distributed to the rear console register 94, a floor duct register, 96, the instrument panel duct register 98, or the window defrost duct register 99. Other dampers may be provided to deter air flow to the floor duct, instrument panel duct, or window defrost duct.

Figure 9:
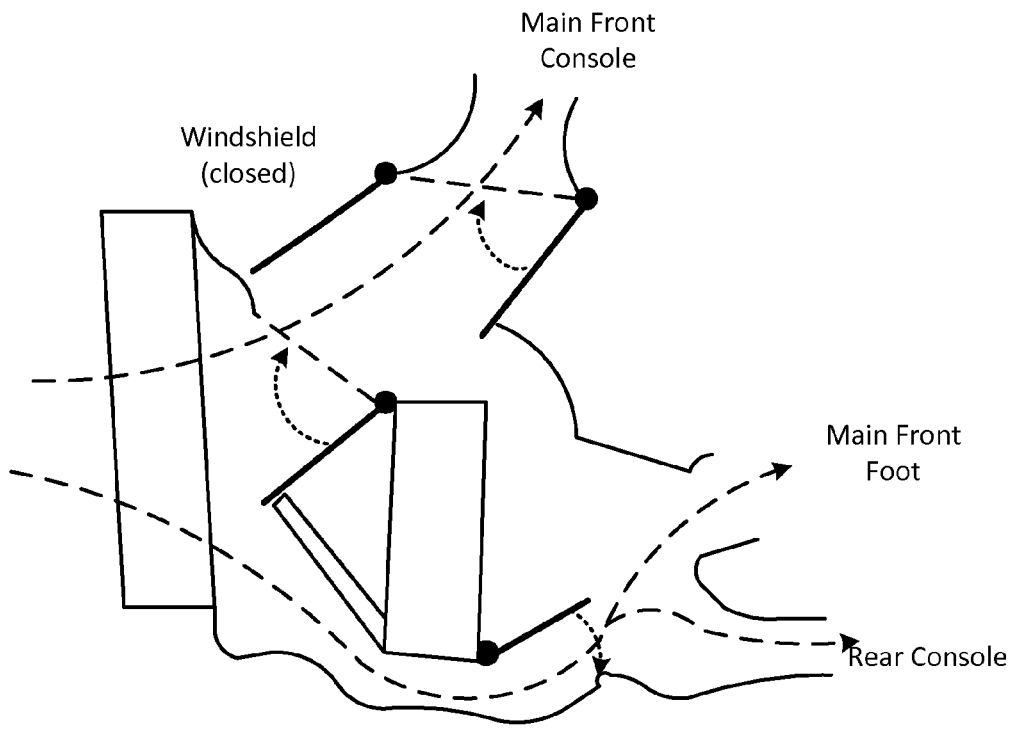
FIG. 9 illustrates an air HVAC system of FIG. 8 when in cooling mode.
Figure 10:
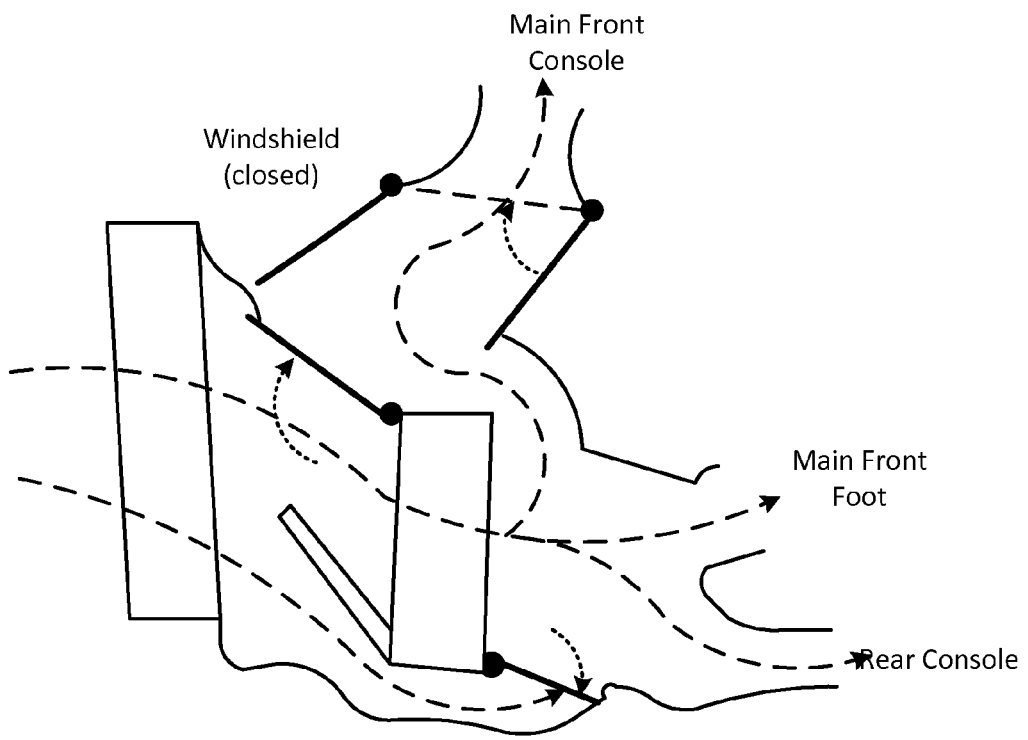
FIG. 10 illustrates an air HVAC system of FIG. 8 when in heating mode.

When the temperature damper door 92 is open or partially open, air flow is directed through the heater core 88. If the temperature damper door is fully opened, then cooled air is prevented from bypassing the heater core 88, and substantially all forced air is directed through the heater core for heating. If the temperature damper door is positioned between a fully closed position and fully open position, then a portion of the cooled air is diverted around the heater core 88 and a portion of the cooled air is directed through the heater core 88. The position of the temperature damper door 92 is based on the temperature setting set by a user of the vehicle. If the temperature damper 92 is in a partially open position, then the portion of the heated air output from the heater core 88 and the portion of the cooled air diverted around the heater core 88 are mixed in the mixing chambers 90 and 91 for generating a blended condition air. FIG. 9 illustrates the flow of forced air in the HVAC system when in cooling mode, and FIG. 10 illustrates the flow of forced air in the HVAC system when in heating mode. It should be understood that the above HVAC configuration is exemplary and the invention described herein and be implemented with other HVAC configurations without deviating from the scope of the invention.

Figure 11:
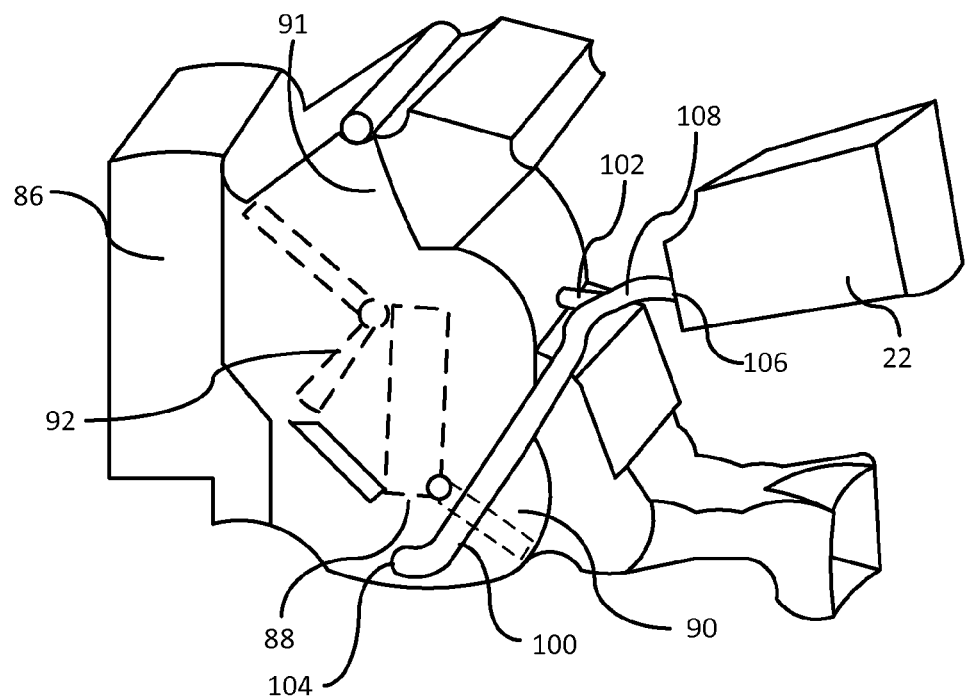
FIG. 11 is an illustration of an exemplary HVAC system including an air flow feature for distributing air to the base charging unit.

FIG. 11 illustrates the HVAC system including an air flow feature for providing conditioned air directly to the location of the base charging station. The HVAC system further includes a primary duct 100 and a branch duct 102 for providing conditioned air to the ICS bin 22. The primary duct 100 is a cool airflow delivery conduit for delivering cooled air output by the evaporator 86 to the ICS bin 22. The primary duct 100 attaches the HVAC module, herein referred to as an inlet 104, at a location downstream of the evaporator 86 and upstream of the mixing chamber 90. The primary duct also attaches to the ICS bin 22, herein referred to as an exit 106. The primary duct 100 maintains a substantially same uniform cross-sectional flow area from the inlet 104 to the exit 106. A gradual increase of the cross-sectional area of the primary duct 100 by 5%-10% from the inlet 104 to the exit 106 may be used to reduce a total pressure drop along the primary duct 100.

The branch duct 102 extends from the HVAC module to the primary duct 104 for supplying warm conditioned air to the primary duct 100 for blending the cool air in the primary duct 100 with the warm are output from the heater 88. As a result, a portion of the primary duct after the junction of the primary duct 100 and the branch duct 102 functions as a mixing chamber 108 for blending the cool air and heated air.

In regards to the pressure drop along the branch duct 102, at least a 20 Pascal (Pa.) pressure difference is preferred between the HVAC module and the primary duct. The higher the pressure drop, the greater the increase of blending hot air from the branch duct. Therefore, a 20~40 Pa. pressure drop is preferred for the branch duct. For example, if the cross-sectional area of the primary duct 100 is 260 mm$^2$, then a cross-sectional area of the branch duct 102 would be between 150 mm$^2$ and 260 mm$^2$.

The temperature of the thermal blending of the warm air and the cooled provided to the ICS bin 22 can further be controlled by a location of where the branch duct 102 attaches from the HVAC module to the primary duct 100, such as a location that will provide an optimal pressure distribution. Such a location for the branch duct 102 to attach to HVAC module at a location where maximum air flow is generated. This can be obtained by either modeling or measuring the temperature and pressure areas of the HVAC module, primary duct 100, and secondary duct 102.

Figure 12:
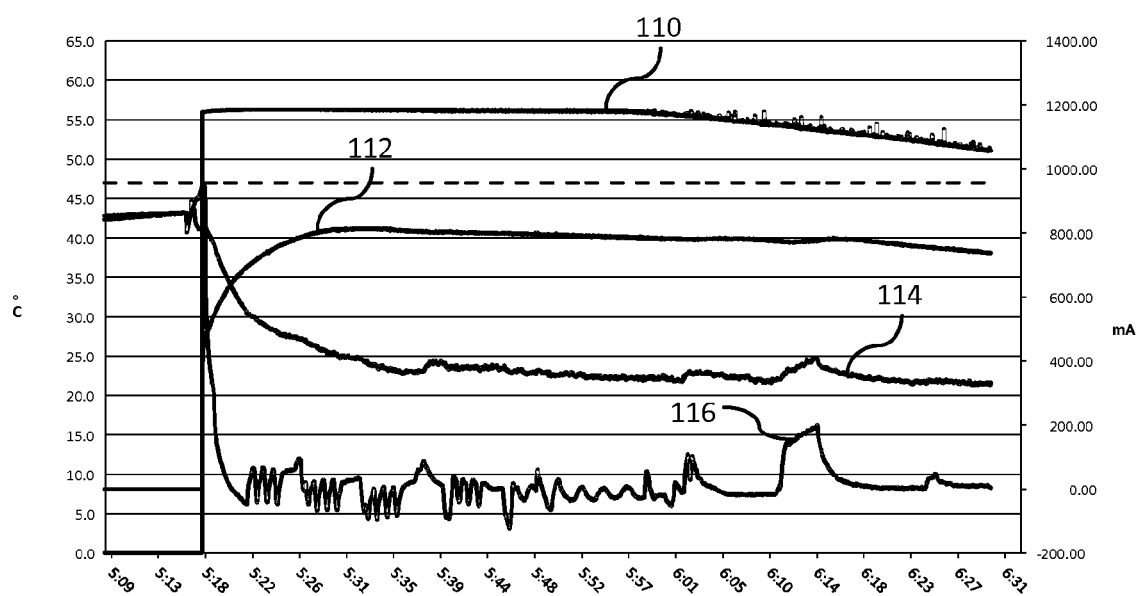
FIG. 12 is an exemplary phone charging event illustrating measurement data for an exemplary cold soak test.

FIG. 12 illustrates a graph where of an exemplary phone charging event based on temperature over time with the aid of thermal cooling the portable device utilizing the cooled air directly vented from the HVAC system. The conditions as illustrated in the graph include the temperature damper door closed such that no air flow is generated through the heater. Therefore, all thermal air flow provided to the ICS bin is from the primary conduit utilizing only the cooled air.

The recorded data for temperature and current measurements are as follows: portable device charging current 110, portable device battery temperature 112, ICS bin temperature 114, and HVAC duct temperature 116. As illustrated in FIG. 12, the ICS bin temperature 114, and air conditioning vent temperature 116 are respective temperatures recorded after the vehicle has been at rest soaking on a hot, sunny day.

The temperature of the portable device (e.g., battery) is initially low since it is assumed that the portable device is not initially stored in the vehicle. At the 5:18 time mark, the portable device is brought into the vehicle, the vehicle is started, and inductive charging of the portable device is initiated. As shown by the battery temperature recorded data 112, the temperature of the portable device battery immediately increases. The temperature increase is initially due to current draw by the portable device due to charging the battery. As charging continues over time, the portable device battery temperature 112 increases further due to the ambient temperature of the vehicle.

As the vehicle continues to operate after the ignition start with the AC enabled, the HVAC duct temperature 116 decreases at a significant rate once the evaporator removes heat from the force air. Eventually a substantially steady state temperature is recorded in the HVAC duct. In addition, the ICS bin will enter a steady state temperature as illustrated by the recorded ICS bin temperature 114.

In analyzing the flow of the portable charging device current 110, FIG. 12 shows that a full current charge of approximately 1200 mA is supplied when charging is first initiated and continues at a steady state rate of approximately 1200 mA. The temperature of the portable device battery maintains a temperature of substantially 40° C. (104° F.) which is below the predetermined temperature (e.g., 47° C. (117° F.)). The predetermined temperature is the threshold that safety countermeasures within the portable device will be activated reducing the charging current to a trickle charge. As shown in FIG. 12, the cool air ventilation provided directly to the ICS bin regulates the temperature of portable device battery below predetermined temperature so that optimum charging of the battery occur.

Figure 13:
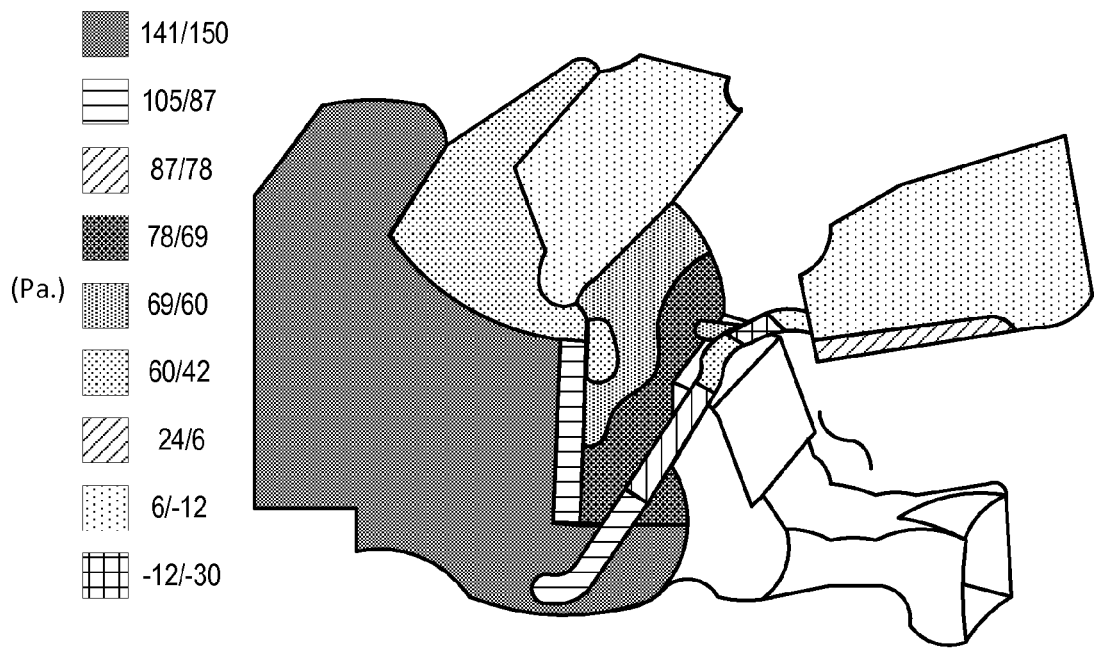
FIG. 13 is an exemplary pressure distribution model which identifies the various pressure differences in the HVAC module.

FIG. 13 illustrates pressure distribution model which identifies the various pressure differences in the HVAC module, primary and branch ducts, and ICS bin. As shown, a desired location is selected to attach the branch duct to the HVAC module that provides the desired pressure differential (e.g., 20~40 Pa.) drop between the primary duct and the branch duct. In addition, the pressure flowing in the ICS bin 22 can be used as other criteria for selecting the attachment location of the branch duct to the HVAC module and primary duct. It should be understood that a respective location for obtaining the warm air from the HVAC model be determined based on factors that include, but are not limited, length of branch duct, flow pressure for warm air, flow pressure for cool air, and temperature of region in the HVAC module, flow areas of the primary and branch ducts.

Figure 14:
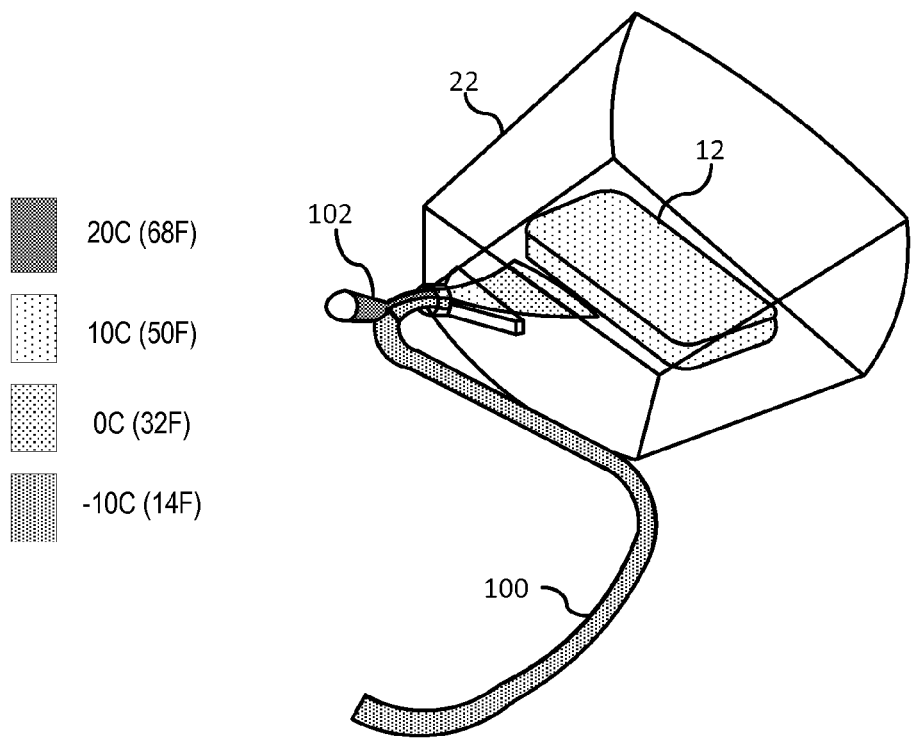
FIG. 14 is an air flow temperature distribution and portable device temperature distribution chart.

FIG. 14 illustrates an air flow temperature distribution and portable device temperature distribution in utilizing a blending of conditioned air flows from the primary duct and branch duct. As is shown, cooler air flow is distributed in the primary duct 100, whereas warm air flow is distributed in the branch duct 102. The blending of the air flows generates temperature in the ICS bin 22 that maintains the portable device at a respective temperature that is ideal for optimally charging the battery or the portable device.

The attachment of the primary duct 100 to the ICS bin 22 is positioned at a location that offers air flow distribution evenly to the entire portable device. Preferably, the portable device 12 is seated within the ICS bin 22 and utilizes a heat dissipation feature such elevated resting surface. The portable device is shown disposed on a powermat surface of the base charging unit. The powermat includes spacers for creating an air gap between the surface of the powermat and the surface of the portable device. The spacers may include any configuration or shape that provides a separation while allowing air flow, such as dimples, ribs, studs, posts, balls, squares, or any other shape or configuration that will support and maintain spacing between the portable device and the exterior surface of the powermat.

As illustrated in FIG. 14, the air forced out of the primary duct 100 to the ICS bin 22 is directed at the air gap created by the spacers. This assures that conditioned air is provided to the region would have the least amount of air flow in ambient conditions (i.e., without directed airflow). A configuration of the outlet in the ICS bin may be an in-molded ventilation channel that can project the air directly across the air gap and also around the surrounding surface of the portable device.

Referring again to FIG. 11, it should be understood that the warm air provided by the branch conduit 102 is vital for maintaining heat to the portable device during cold conditions. Typically, if a vehicle is operated during cold ambient conditions, the heat supplied by the various vehicle ducts (e.g., floor duct, console duct, window defrost duct) would warm the interior passenger compartment adequately, including the ICS bin, and maintain the portable device at a respective temperature in which the portable device can be optimally charged. However, if only the primary conduit 100, which supplies the cooled air is implemented (i.e., no secondary conduit 102), then the primary conduit 100 would have adverse affects during the cold temperature conditions. The inlet 104 which obtains cooled air from the HVAC system is upstream of the mixing chamber 90. The result would be cooled air blown on the portable device during cold conditions. This cold air from the primary conduit (without the aide of the secondary conduit if it were not implemented), would be counterproductive during extreme cold conditions as the heat supplied by the various passenger compartment vents during the extreme cold temperature conditions would be insufficient to compensate for the cold air supplied by the primary conduit 100. As a result, the temperature conditions of the portable device could decrease to a point where charging is less than optimum. The following figures describe this condition.

Figure 15:
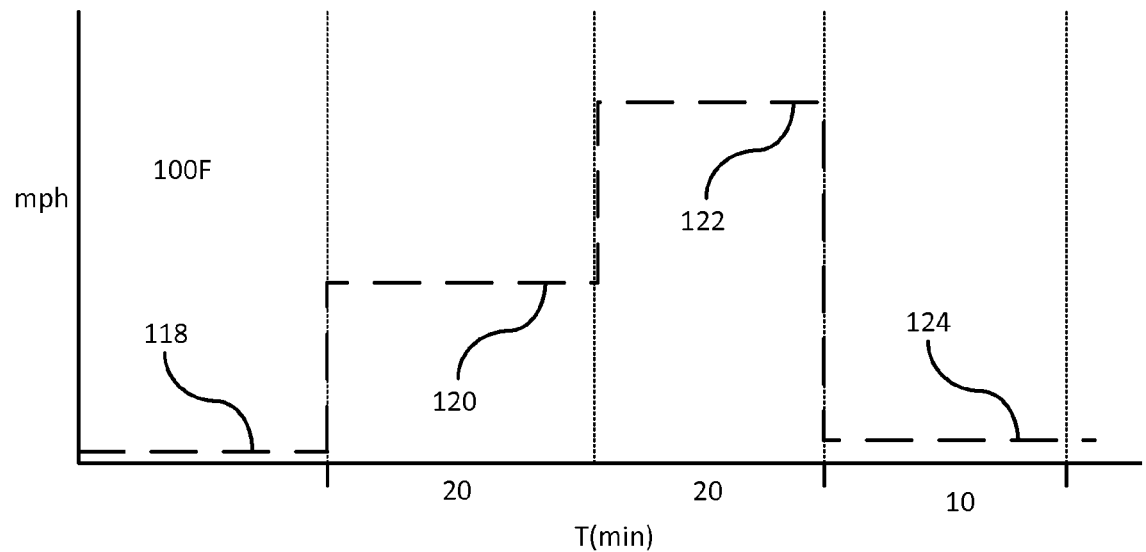
FIG. 15 is an exemplary cold soak and heat-up thermal test.

FIG. 15 illustrates a cold soak and warm-up thermal test during a winter drive. The x-axis represents time in minutes and the y-axis represents vehicle speed. Engine speed is directly related to warming of the engine, which in turn, relates to when the vehicle is capable of supplying heat to the interior passenger compartment. During a cold soak 118, the vehicle is soaked at a temperature of −25° C. (−13° F.) for a predetermined period of time until the engine oil temperature reaches −20° C. (−4° F.). When the engine temperature reaches −20° C., the engine is started that vehicle starts driving at 40 kph shown generally at 120. The test condition is when the vehicle is operating, the following conditions are present: heater on; air is recirculating; temperature set to 72° F.; wireless charging of 1 A; and a predetermined spacing gap (e.g., 2 mm) is present between the portable device and the charging mat of the base charging unit. After approximately driving 20 minutes at 40 kph, the vehicle speed is increased to 100 kph shown generally at 122. After approximately driving 20 minutes at 100 kph, the vehicle is set to park idling for 10 minutes shown generally at 124.

Figure 16:
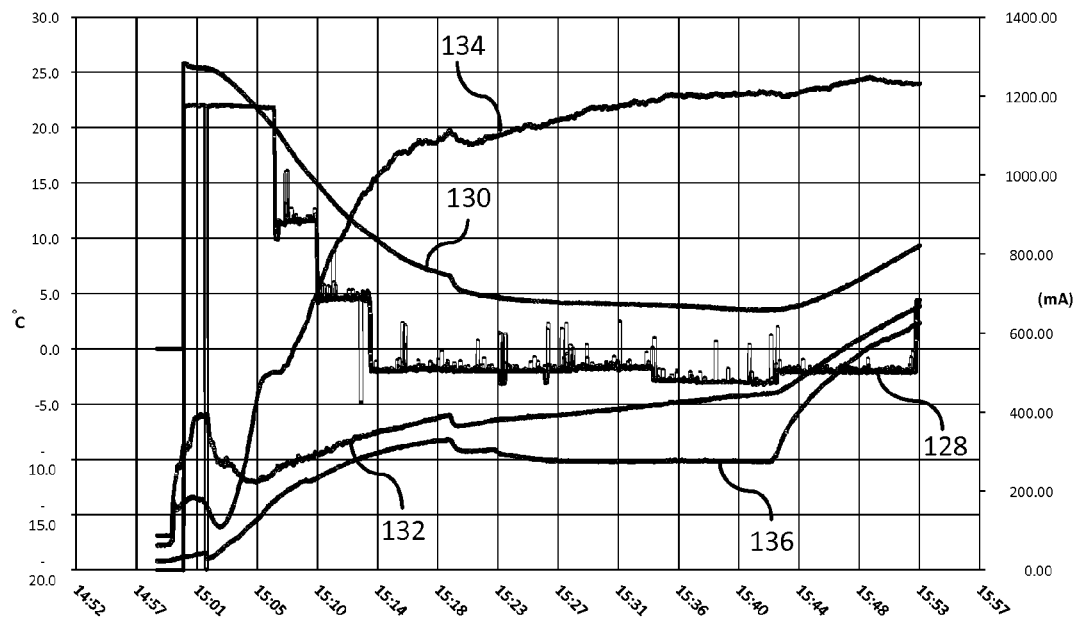
FIG. 16 is an exemplary phone charging event illustrating measurement data for the exemplary cold soak test for the cold soak test of FIG. 15.

FIG. 16 illustrates an exemplary phone charging event based on temperature over time for a cold test where only the primary conduit is implemented. The recorded data for temperature and current measurements are as follows: portable device charging current 128, portable device battery temperature 130, ICS bin temperature 132, breath temperature 134, and the primary duct temperature 136. As illustrated in FIG. 16, the ICS bin temperature 132, breath temperature 134, and primary conduit temperature 136 are respective temperatures recorded after the vehicle has been at rest soaking on a cold, winter day. The temperature of the portable device is warmer than that of the ambient temperature since it is assumed that the portable device is not in the vehicle and is brought into the vehicle at time just prior to starting the vehicle. At the 15:01 time mark, the vehicle is started, and inductive charging of the portable device is initiated. As shown by the battery temperature recorded data 130, the temperature of the battery of the portable device immediately increases. The temperature increase is initially due to current draw by the portable device due to charging the battery. As charging continues over time, the portable device battery temperature 130 decreases due to the ambient temperature of the vehicle.

As the vehicle continues to operate after the ignition start with the heating enabled, the primary conduit temperature 136 increases gradually and eventually a substantially steady state temperature is recorded. The cooled air entering the primary conduit is output in the ICS bin forcing cold air on the portable device. As a result, the cooled air from the primary conduit is counterproductive to the heat output from the register vents of the passenger compartment.

In analyzing the flow of the portable charging device current 68, FIG. 16 shows that a current charge of approximately 1200 mA is supplied when charging is first initiated. The temperature of portable device battery slowly decreases due to the temperature in the ICS bin as a result of the cold air directed on it from the primary conduit. In response to the temperature decrease of the portable device, the charging current to the portable device charging decreases accordingly. As shown in FIG. 16, a steady state charging current of 450 mA occurs after approximately 15 minutes. This low charge rate is less than optimal for charging the battery of the portable device. Therefore, it is pertinent that blended air be supplied to the ICS bin under such conditions to maintain the battery temperature at an ideal range that ensures an optimum charging rate.

The above thermal airflow system as described herein ensures that an optimum temperature range is provided for wireless charging of the portable device under extreme temperatures. The thermal airflow system provides a unique air flow as result of the thermal blending design between the primary duct carrying cool air flow from the evaporator and the branch duct carrying heated air flow from the heater outlet. The advantages include, but are note limited to, enable similar charge efficiency compared with the chorded charging system; ensures the battery charging to be within an acceptable temperature range; improves customer experience with wireless charging by ensuring portable devices charge at an optimal rate to increase battery SOC, which improves battery life and also reduces warranty costs in users bringing their vehicle in for repair due to the portable device not charging sufficiently. It is also understood that the thermal air flow design is not limited to the ICS bin, but may be supplied to any location where the powermat is utilized.

While certain embodiments of the present invention have been described in detail, those familiar with the art to which this invention relates will recognize various alternative designs and embodiments for practicing the invention as defined by the following claims.

What is claimed is:

1. A thermal conditioning system comprising:
an open enclosure charging unit including at least one surface generating an electromagnetic field for inductively charging a portable device;
a conditioned air source generating conditioned air;
a primary conduit coupled to the conditioned air source and the open enclosure charging unit, the primary conduit dedicated to deliver the conditioned air only from the conditioned air source to the open enclosure charging unit;
wherein the conditioned air output by the primary conduit maintains a temperature of the portable device at a predetermined temperature range within the open enclosure charging unit.

2. The thermal conditioning system of claim 1 wherein the conditioned air source includes a vehicle heating ventilation air conditioning unit.

3. The thermal conditioning system of claim 1 wherein the primary duct is coupled to a first region of the conditioned air source where cool air is flowing, the cool air being at least a portion of the conditioned air.

4. The thermal conditioning system of claim 3 further comprising a secondary duct coupled between the conditioned air source and the primary duct for delivering heated air to the primary duct, the secondary duct is coupled to a second region of the conditioned air source where the heated air is flowing, the heated air being another portion of the conditioned air.

5. The thermal conditioning system of claim 4 wherein the preteremined temperature range of the conditioned air delivered to the open enclosure charging unit is in a range of 10° C. to 45° C.

6. The thermal conditioning system of claim 4 wherein a location where the secondary duct couples to the conditioned air source based on generating a maximum air flow in the secondary duct.

7. The thermal conditioning system of claim 4 wherein a location where the secondary duct couples to the conditioned air source is selected based on a predetermined pressure drop in the secondary duct.

8. The thermal conditioning system of claim 7 wherein the predetermined pressure drop is between 20-40 Pa.

9. The thermal conditioning system of claim 4 wherein the conditioned air source includes a damper and a heater core, the damper being upstream of the heater core, the damper operable between an open and closed positioned for heating air flowing within the conditioned air source.

10. The thermal conditioning system of claim 9 wherein the damper is controlled based on an interior passenger compartment setting.

11. The thermal conditioning system of claim 9 wherein the secondary duct is coupled to the second region of the conditioned air source downstream of the damper, wherein the heated air is provided to the secondary duct when the damper is in an at least a partially open position, wherein the heated air flowing through the secondary duct blends with cool air flowing in the primary duct for delivering the conditioned air to the open enclosure charging unit.

12. The thermal conditioning system of claim 9 wherein the secondary duct is coupled to the second region of the conditioned air source downstream of the damper, wherein only cool air is provided to the open enclosure charging unit in response to the damper being in a closed position, wherein the damper in the closed position prevents the heated air from flowing to the secondary duct.

13. The thermal conditioning system of claim 4 wherein a portion of the primary duct downstream from where the secondary duct joins the primary duct functions as a mixing chamber for mixing cool air flow and the heated air.

14. The thermal conditioning system of claim 4 wherein the secondary duct is disposed within a vehicle, wherein the secondary duct is a dedicated duct for only delivering the heated air from the conditioned air source to the primary duct.

15. The thermal conditioning system of claim 1 wherein the open enclosure charging unit includes an orifice that couples to the primary duct to the open enclosure charging unit for delivering the conditioned air to an interior of the open enclosure charging unit.

16. The thermal conditioning system of claim 15 wherein the orifice is directed toward the portable device within the open enclosure charging unit.

17. The thermal conditioning system of claim 1 wherein the open enclosure charging unit is disposed within an interior passenger compartment of a vehicle.

18. The thermal conditioning system of claim 1 wherein the open enclosure charging unit is disposed within an integrated console storage unit within a center console stack of a vehicle.

19. The thermal conditioning system of claim 1 wherein the open enclosure charging unit is disposed within a pocketed area of a center console.

* * * * *